(12) United States Patent
Korol et al.

(10) Patent No.: US 9,419,560 B2
(45) Date of Patent: Aug. 16, 2016

(54) LOW POWER MULTI-STACKED POWER AMPLIFIER

(71) Applicant: QUALCOMM Incorporated, San Diego, CA (US)

(72) Inventors: Victor Korol, San Diego, CA (US); Shu-Hsien Liao, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 57 days.

(21) Appl. No.: 14/286,877

(22) Filed: May 23, 2014

(65) Prior Publication Data
US 2015/0340992 A1  Nov. 26, 2015

(51) Int. Cl.
*H03F 3/04* (2006.01)
*H03F 1/02* (2006.01)
*H03F 3/193* (2006.01)
*H03F 3/21* (2006.01)
*H03F 1/22* (2006.01)
*H03F 1/52* (2006.01)
*H03F 3/24* (2006.01)

(52) U.S. Cl.
CPC ............ *H03F 1/0205* (2013.01); *H03F 1/0211* (2013.01); *H03F 1/0261* (2013.01); *H03F 1/0272* (2013.01); *H03F 1/223* (2013.01); *H03F 1/523* (2013.01); *H03F 3/193* (2013.01); *H03F 3/21* (2013.01); *H03F 3/245* (2013.01); *H03F 2200/18* (2013.01); *H03F 2200/27* (2013.01); *H03F 2200/451* (2013.01); *H03F 2200/513* (2013.01); *H03F 2200/61* (2013.01)

(58) Field of Classification Search
CPC ........................................................ H03F 3/04
USPC ........................................... 330/311, 296, 277
See application file for complete search history.

(56) References Cited

U.S. PATENT DOCUMENTS

| | | | | |
|---|---|---|---|---|
| 6,320,414 B1* | 11/2001 | Annema | .......... | H03K 17/08142 326/80 |
| 6,768,369 B1* | 7/2004 | Dunn | .................. | H03K 17/145 327/534 |
| 7,248,120 B2 | 7/2007 | Burgener et al. | | |
| 7,489,202 B1 | 2/2009 | Griffiths et al. | | |
| 7,786,807 B1 | 8/2010 | Li et al. | | |
| 7,795,968 B1 | 9/2010 | Li et al. | | |
| 8,350,624 B2 | 1/2013 | Lam | | |
| 8,432,224 B1* | 4/2013 | Woo | ...................... | H03F 1/0227 330/279 |
| 8,487,706 B2 | 7/2013 | Li et al. | | |
| 2007/0075693 A1* | 4/2007 | Xi | ............................ | G05F 3/205 323/282 |
| 2011/0025422 A1* | 2/2011 | Marra | ....................... | H03F 1/30 330/296 |
| 2012/0049956 A1* | 3/2012 | Lam | ...................... | H03F 1/0272 330/253 |
| 2013/0049867 A1* | 2/2013 | Pinarello | ............... | H03F 1/0211 330/277 |

OTHER PUBLICATIONS

International Search Report and Written Opinion—PCT/US2015/028879—ISA/EPO—Jul. 24, 2015, 13 pages.

(Continued)

*Primary Examiner* — Patricia T Nguyen
(74) *Attorney, Agent, or Firm* — Toler Law Group, PC

(57) ABSTRACT

An apparatus includes a plurality of stacked transistors in a multi-stacked power amplifier. At least one transistor of the plurality of stacked transistors is configured to operate in a first mode and in a second mode. The at least one transistor of the plurality of stacked transistors is configured to be biased by a low power biasing network to operate in the first mode.

20 Claims, 5 Drawing Sheets

(56) References Cited

OTHER PUBLICATIONS

Li M., et al., "A single-chip 2.4GHz double cascode power amplifier with switched programmable feedback biasing under multiple supply voltages in 65nm CMOS for WLAN application," Radio Frequency Integrated Circuits Symposium (RFIC), 2010 IEEE, IEEE, Piscataway, NJ, USA, May 23, 2010, pp. 391-394, XP031684144, ISBN: 978-1-4244-6240-7 p. 391, left-hand column, line 1-p. 394, right-hand column, line 12; figures 1,2,3,4,5,6,7,8,9.

* cited by examiner

LOW POWER MULTI-STACKED POWER AMPLIFIER

I. FIELD

The present disclosure is generally related to a low power multi-stacked power amplifier.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless devices may include power amplifiers that operate over a wide range of transmission radio frequency (RF) power levels. Power amplifiers may reduce current consumption by maintaining a relatively high efficiency at low transmission RF power levels and at high transmission RF power levels. For example, multi-stacked complementary metal oxide semiconductor (CMOS) power amplifiers may operate using a reduced supply voltage at low transmission RF power levels to maintain efficient operation, and thus reduce power consumption. However, the topology of multi-stacked CMOS power amplifiers may limit the minimum supply voltage for operation at a relatively high voltage level as compared to a minimum supply voltage for single-stacked power amplifier alternatives. For example, a multi-stacked CMOS power amplifier may require that the minimum supply voltage be large enough to operate two or more stacked transistors as opposed to operating a single transistor. Due to the relatively large minimum supply voltage, power consumption by multi-stacked CMOS power amplifiers may be greater than for a single-stacked power amplifier.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
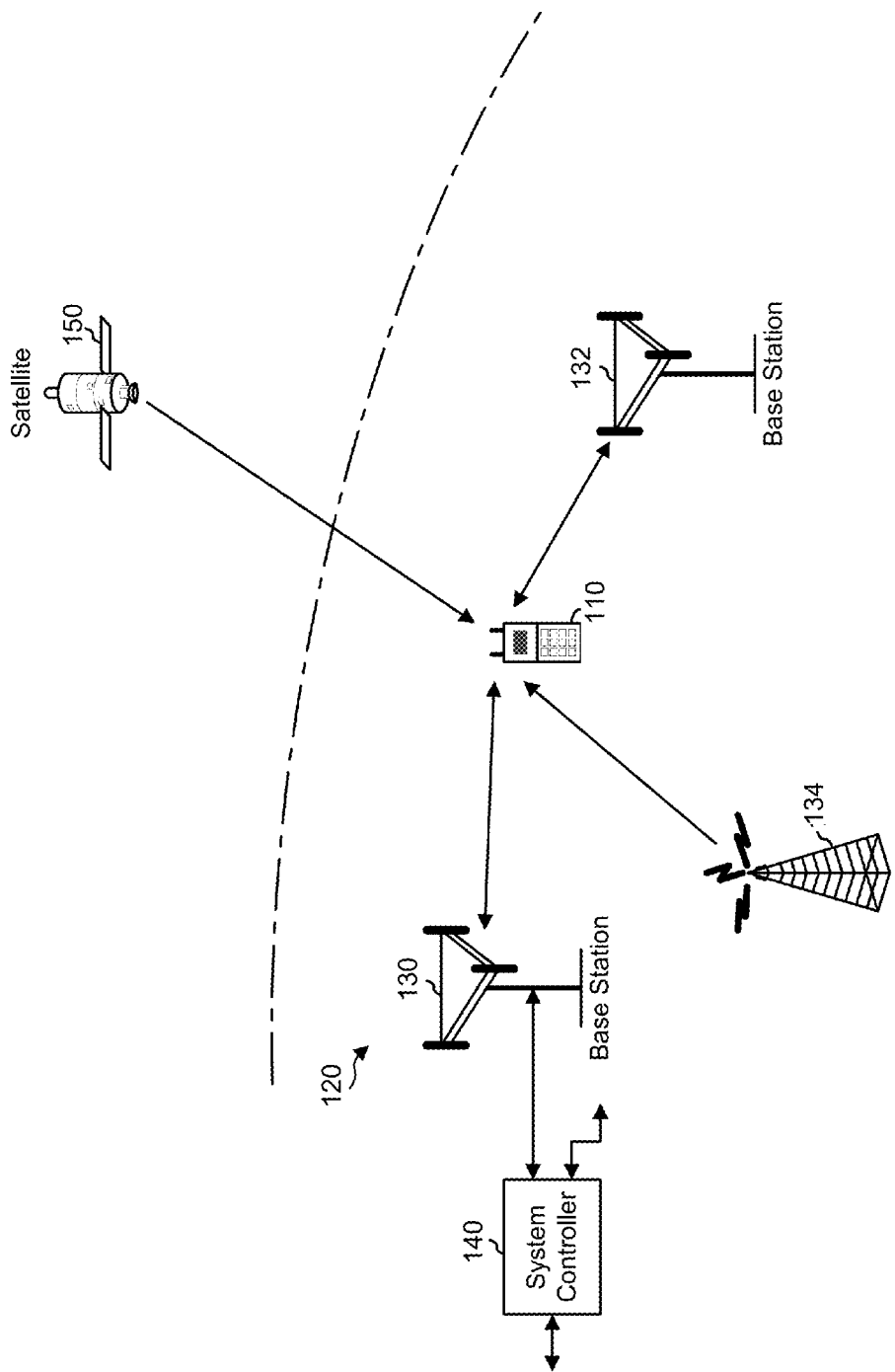
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Figure 2:
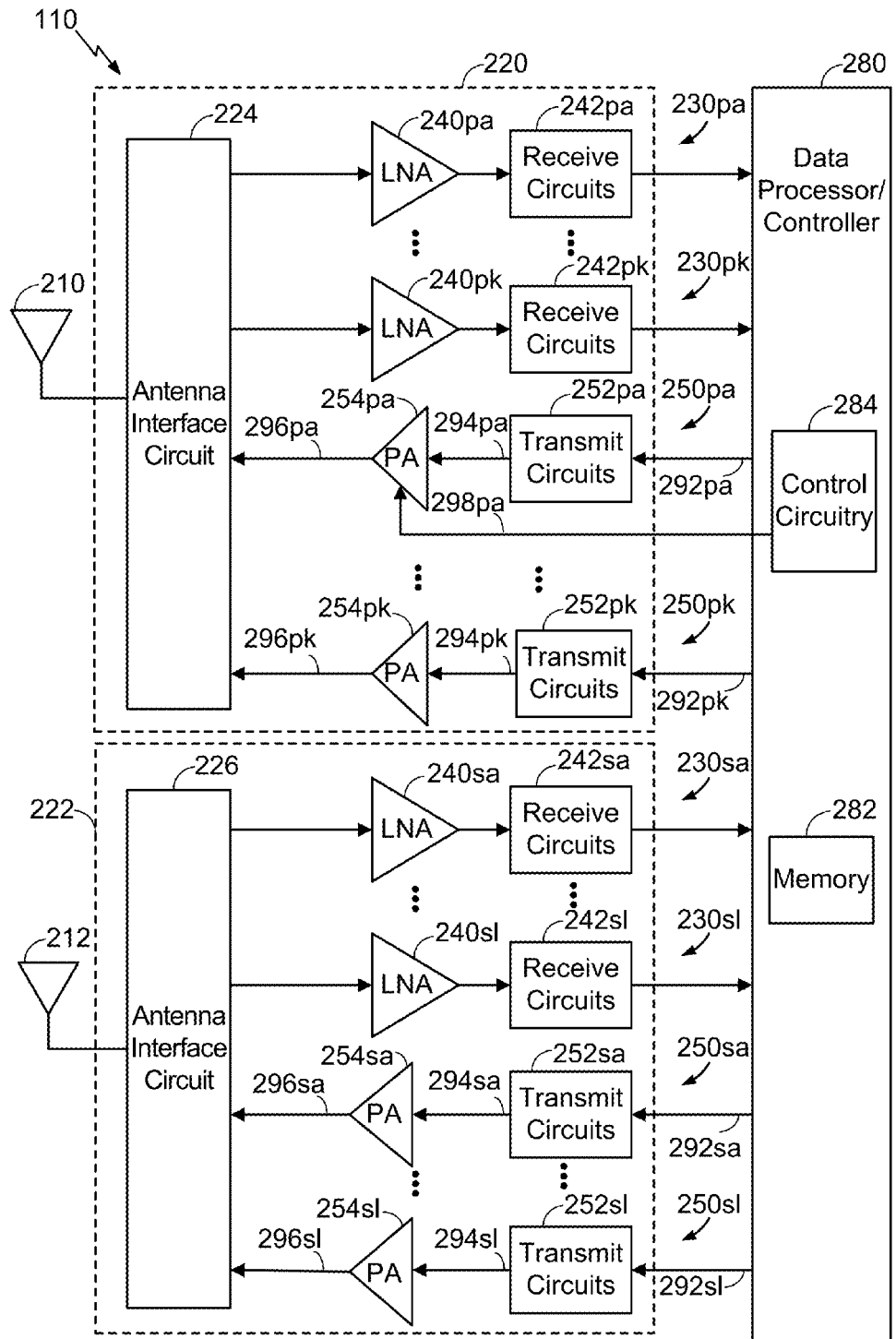
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230*pa* to 230*pk* and multiple (K) transmitters 250*pa* to 250*pk* to support multiple frequency bands, multiple radio technologies, carrier aggregation, etc. Transceiver 222 includes multiple (L) receivers 230*sa* to 230*sl* and multiple (L) transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230*pa*, 230*pk*, 230*sa*, 230*sl* includes an LNA 240*pa*, 240*pk*, 240*sa*, 240*sl* and a receive circuit 242*pa*, 242*pk*, 242*sa*, 242*sl*, respectively. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230*pa* is the selected receiver. Within receiver 230*pa*, an LNA 240*pa* amplifies the input RF signal and provides an output RF signal. Receive circuits 242*pa* downconvert the output RF signal from RF to baseband, amplify and filter the downconverted signal, and provide an analog input signal to data processor 280. Receive circuits 242*pa* may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230*pa*.

In the exemplary design shown in FIG. 2, each transmitter 250*pa*, 250*pk*, 250*sa*, 250*sl* includes a transmit circuit 252*pa*, 252*pk*, 252*sa*, 252*sl* and a multi-stacked power amplifier (PA) 254*pa*, 254*pk*, 254*sa*, 254*sl*, respectively. For data transmission, data processor 280 processes (e.g., encodes and modulates) data to be transmitted and provides an analog output signal to a selected transmitter. The description below assumes that transmitter 250*pa* is the selected transmitter. Within transmitter 250*pa*, transmit circuits 252*pa* amplify, filter, and upconvert the analog output signal from baseband to RF and provide a modulated RF signal. Transmit circuits 252*pa* may include amplifiers, filters, mixers, matching circuits, an oscillator, an LO generator, a PLL, etc. A stacked PA 254*pa* receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250*pa*.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners.

In an exemplary embodiment, the multi-stacked power amplifiers 254*pa*, 254*pk*, 254*sa*, 254*sl* may receive signals 294*pa*, 294*pk*, 294*sa*, 294*sl* (e.g., input signals) from the transmit circuits 252*pa*, 252*pk*, 252*sa*, 252*sl*, respectively. One or more of the multi-stacked power amplifiers 254*pa*, 254*pk*, 254*sa*, 254*sl* may be a biased to a low power mode according to the techniques described with respect to FIG. 3. For example, one or more of the multi-stacked power amplifiers 254*pa*, 254*pk*, 254*sa*, 254*sl* may include a low power biasing network selectively coupled to at least one transistor of a plurality of stacked transistors. An example of a low power biasing network is the low power biasing network 316 of the multi-stacked power amplifier 254*pa* as described in further detail with respect to FIG. 3. In another exemplary embodiment, a low power biasing network may be coupled to one or more of the multi-stacked power amplifiers 254*pa*, 254*pk*, 254*sa*, 254*sl*. For example, the low power biasing network may be external to one or more of the multi-stacked power amplifiers 254*pa*, 254*pk*, 254*sa*, 254*sl*.

Figure 3:
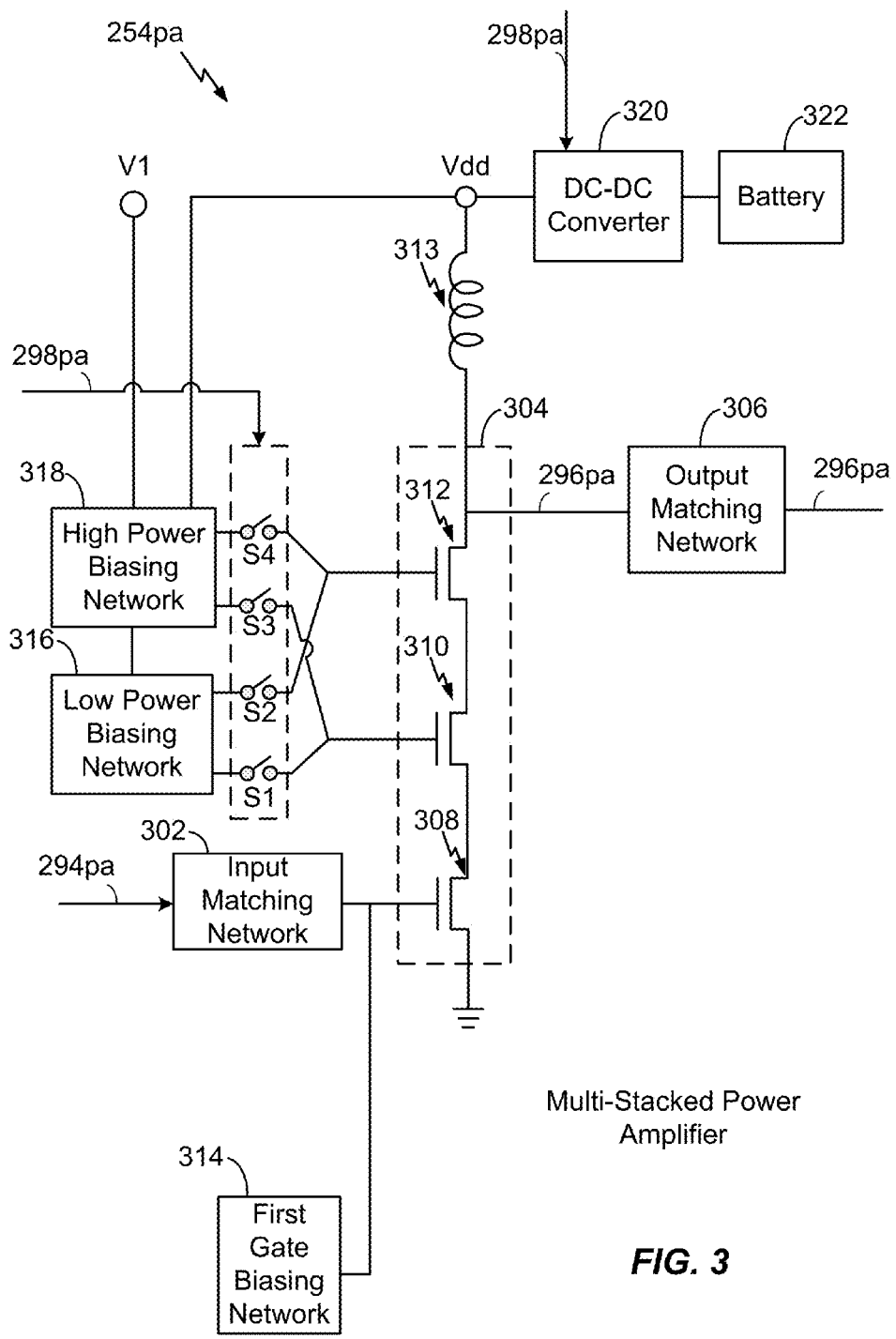
FIG. 3 is a diagram that depicts an exemplary embodiment of a multi-stacked power amplifier.

In an exemplary embodiment, one or more of the multi-stacked power amplifiers 254*pa*, 254*pk*, 254*sa*, 254*sl* may receive a control signal from the control circuitry 284 to selectively couple a transistor to the low power biasing network, as described in further detail with respect to FIG. 3. The multi-stacked power amplifiers 254*pa*, 254*pk*, 254*sa*, 254*sl* may amplify the input signals 294*pa*, 294*pk*, 294*sa*, 294*sl* to generate amplified signals 296*pa*, 296*pk*, 296*sa*, 296*sl*, respectively.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. For example, the controller 280 may include control circuitry 284 to bias one or more of the multi-stacked power amplifiers 254*pa*, 254*pk*, 254*sa*, 254*sl* to operate in a low power mode. Additionally, the control circuitry 284 may selectively activate switches (e.g., switches (S1-S4) of FIG. 3) in the multi-stacked power amplifier 254*pa* using a control signal 298*pa*. In another exemplary embodiment, the switches (S1-S4) may be controlled by internal control circuitry (e.g., control circuitry within the multi-stacked power amplifier 254*pa*). A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

Referring to FIG. 3, a diagram of the multi-stacked power amplifier 254*pa* is shown. In an exemplary embodiment, one or more of the multi-stacked power amplifiers 254*pk*, 254*sa*, 254*sl* of FIG. 2 may have a substantially similar configuration as the multi-stacked power amplifier 254*pa*. The multi-stacked power amplifier 254*pa* may be operable to support reduced supply voltages for efficient transmissions.

The multi-stacked power amplifier 254*pa* includes an input matching network 302, a plurality of stacked transistors 304 (e.g., multiple "stacked" transistors), and an output matching network 306. In an exemplary embodiment, the input matching network 302 may be a resistive-inductor-capacitor (RLC) network. The input matching network 302 may be configured to receive the input signal 294*pa* from the transmit circuit 252*pa*. The input matching network 302 may also be configured to perform impedance matching between an input of the multi-stacked power amplifier 254*pa* and a load (e.g., the plurality of stacked transistors 304) of the multi-stacked power amplifier 254*pa*. For example, components of the input matching network 302 may be configured such that a source impedance and a load impedance are substantially a conjugate match (e.g., resistive components having substantially the same resistance and "imaginary" parts having a substantially similar magnitude and opposite polarities).

The input matching network 302 may be coupled to the plurality of stacked transistors 304. In the embodiment shown in FIG. 3, the plurality of stacked transistors 304 includes three transistors (e.g., a first transistor 308, a second transistor 310, and a third transistor 312). However, in other exemplary embodiments, the plurality of stacked transistors 304 may include additional transistors or fewer than three transistors in a stacked transistor configuration. For example, the plurality of stacked transistors 304 may include two serially coupled transistors or more than three serially coupled transistors. A source of the first transistor 308 may be coupled to ground, and a drain of the first transistor 308 may be coupled to a source of the second transistor 310. A drain of the second transistor 310 may be coupled to a source of the third transistor 312. A drain of the third transistor 312 may be coupled to the output matching network 306.

The plurality of stacked transistors 304 may be configured to receive the input signal 294*pa* from the input matching network 302 and amplify the input signal 294*pa* based on a mode of operation of each transistor 308-312. As explained below, each transistor 308-312 may operate according to a first mode (e.g., a linear region of operation) or according to a second mode (e.g., a saturation region of operation). When operating according to the second mode, each transistor 308-312 may correspond to an amplification stage of the multi-stacked power amplifier 254*pa*. For example, the first transistor 308 may correspond to a first amplification stage, the second transistor 310 may correspond to a second amplification stage, and the third transistor 312 may correspond to a third amplification stage. A gate of the first transistor 308 may be coupled to receive the input signal 294*pa* from the input matching network 302. The gain and ruggedness of the multi-stacked power amplifier 254*pa* may increase as more transistors operate according to the second mode to generate the amplified signal 296*pa*. The amplified signal 296*pa* may be provided to the output matching network 306.

In an exemplary embodiment, the output matching network 306 may be an RLC network. The output matching network 306 may be configured to receive the amplified signal 294*pa* from the plurality of stacked transistors 304. The output matching network 306 may also be configured to provide impedance matching.

A first gate biasing network 314 is configured to bias the gate of the first transistor 308 to operate the first transistor 308 in a saturation region. For example, the first gate biasing network 314 may generate and provide a logical low voltage level signal to the gate of the first transistor 308 so that the first transistor 308 operates in the saturation region. As described herein, a transistor operating in the "saturation region" may correspond to a transistor operating with a relatively high sensitivity of the transistor drain-to-source conductivity to gate-to-source controlling voltage (as compared to the drain-to-source conductivity sensitivity of transistors biased to operate in other regions). However, "saturation region" is not limited to scenarios in which a gate-to-source DC bias voltage of a transistor is greater or equal than a threshold voltage of the transistor and a drain-to-source DC bias voltage is greater than or equal to a difference between the gate-to-source voltage and the threshold voltage. Rather, "saturation region" is used to define a region with a relatively high sensitivity of the drain-to-source conductivity to gate-to-source control voltage and may also include a strong-inversion region or a triode region.

The first transistor 308 may amplify the input signal 294*pa* (e.g., a first stage amplification) during operation within the saturation region. For example, the first transistor 308 may control (e.g., increase) an amount of current propagating between source and drain based on the voltage provided to the gate. The amplified signal 296*pa* at the output of the third transistor 312 may be based at least in part on the first stage amplification. If the second transistor 310 is operating in the saturation region, the amplified signal 296*pa* may also be based on a second stage amplification of the second transistor 310. If the third transistor 312 is operating in the saturation region, the amplified signal 296*pa* may also be based on a third stage amplification of the third transistor 312. The region of operations associated with the second transistor 310 and the third transistor 312 may be based on a mode of operation of the multi-stacked power amplifier 254*pa*, as described below.

A DC-DC converter 320 (e.g., an electronic circuit configured to convert a source of direct current (DC) from a first voltage level to a second voltage level) may be coupled to a battery 322. The DC-DC converter 320 may be coupled to generate a supply voltage (Vdd) based on a mode of the multi-stacked power amplifier 254*pa*. For example, the multi-stacked power amplifier 254*pa* may be responsive to the control signal 298*pa* and configured to operate in a low power mode or in a high power mode. The low power mode corresponds to a mode for transmitting at low transmission radio frequency (RF) power levels. The high power mode corresponds to a mode for transmitting at high transmission RF power levels.

During the low power mode, the DC-DC converter 320 may be configured to reduce the supply voltage (Vdd) to a first voltage level to reduce an amount of power consumed via the battery 322 during low power transmissions. As a non-limiting example, the DC-DC converter 320 may be configured to reduce the supply voltage (Vdd) to a voltage between approximately 0.3 volts (V) and 1.2 V during the low power mode. During the high power mode, the DC-DC converter 320 may be configured to increase the supply voltage (Vdd) to a second voltage level to improve efficiency for high power transmissions. As a non-limiting example, the DC-DC converter 320 may be configured to increase the supply voltage above 1.2 V during the high power mode (e.g., from approximately 1.2 V to approximately 4.2V).

In an exemplary embodiment, the drain of the third transistor 312 may be coupled to the supply voltage (Vdd) via an inductor 313. The voltage across the plurality of stacked transistors 304 (e.g., the "voltage drift") and the inductor 313 may be approximately equal to the supply voltage (Vdd). During the high power mode (e.g., when the supply voltage (Vdd) is relatively high), the voltage drift across the plurality of stacked transistors 304 may be relatively high. A high voltage drift may increase the risk that at least one of the transistors 308-312 breaks down. During the low power mode, the minimum supply voltage (Vdd) may be relatively large (e.g., approximately 3 times the drain-to-source voltage of a transistor 308-312 at saturation) due to design constraints of the multi-stacked power amplifier 254*pa*. To illustrate, the minimum supply voltage (Vdd) may be approximately 0.9 V for a 3-stack silicon-on-insulator (SOI) complementary metal-oxide-semiconductor (CMOS) configuration. The relatively large minimum supply voltage (Vdd) during the low power mode may result in increased power consumption.

To alleviate the above concerns during the high power mode and the low power mode, a low power biasing network 316 and a high power biasing network 318 may be selectively coupled to gates of the second transistor 310 and the third transistor 312. For example, a first switch (S1) may selectively couple the low power biasing network 316 to the gate of the second transistor 310, and a second switch (S2) may selectively couple the low power biasing network 316 to the gate of the third transistor 312. A third switch (S3) may selectively couple the high power biasing network 318 to the gate of the second transistor 310, and a fourth switch (S4) may selectively couple the high power biasing network 318 to the gate of the third transistor 312. In an exemplary embodiment, the switches (S1-S4) may be activated by the control signal 298*pa* from the control circuitry 284 of FIG. 2. Although the low power biasing network 316 and the high power biasing network 318 are shown to be included in the multi-stacked power amplifier 254*pa*, in other embodiments, one low power biasing network 316 and the high power biasing network 318 may be external to the multi-stacked power amplifier 254*pa*.

When the first switch (S1) is activated (e.g., closed), the third switch (S3) is deactivated. When the third switch (S3) is activated, the first switch (S1) is deactivated. When the second switch (S2) is activated, the fourth switch (S4) is deactivated. When the fourth switch (S4) is activated, the second switch (S4) is deactivated. The first switch (S1) and the second switch (S2) may be activated during the low power mode.

The third switch (S3) and the fourth switch (S4) may be activated during the high power mode.

During operation in the high power mode, the high power biasing network 318 may alleviate (or reduce the likelihood of) breakdown scenarios when the multi-stacked power amplifier 254pa operates in the high power mode (e.g., when the supply voltage (Vdd) is at the second voltage level). For example, the high power biasing network 318 may be configured to generate and provide a logical low voltage signal to the gates of the second and third transistors 310, 312 when the third and fourth switches (S3-S4), respectively, are activated. As explained below, providing the logical low voltage signal (based on the supply voltage (Vdd)) to the gates of the second and third transistors 310, 312 may cause the second and third transistors 310, 312 to operate in the saturation region, and the relatively high voltage drift across the plurality of stacked transistors 304 may be distributed across each transistor 308-312 such that the transistors 308-312 do not breakdown.

Figure 4A:
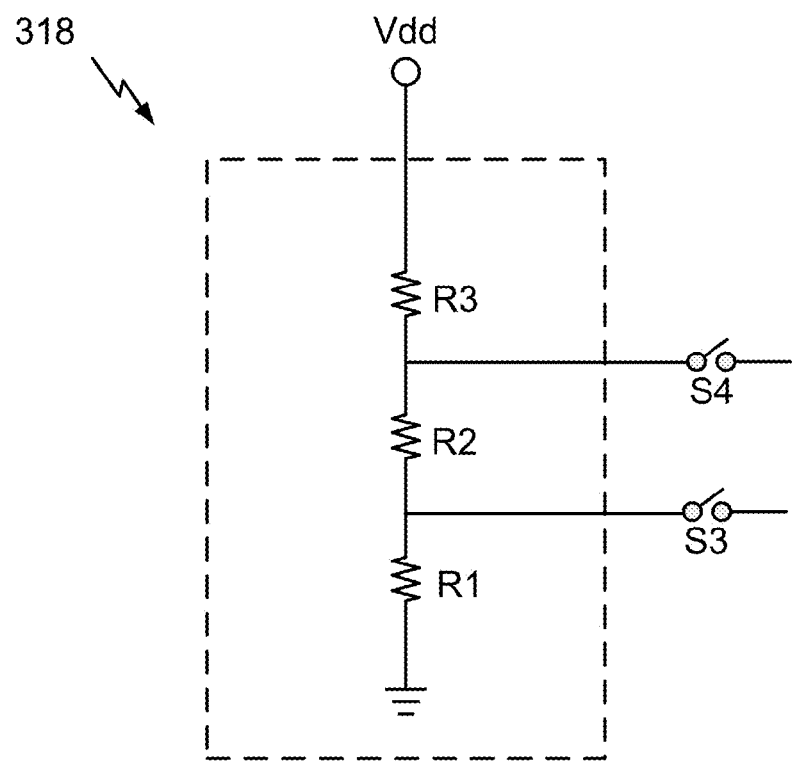
FIG. 4A is a diagram that depicts an exemplary embodiment of the high power biasing network of FIG. 3.

Referring to FIG. 4A, an exemplary embodiment of the high power biasing network 318 is shown. For example, the high power biasing network 318 may have a voltage divider type configuration such that the voltage applied to the gate of the second transistor 310 via the third switch (S3) and the voltage applied to the gate of the third transistor 312 via the fourth switch (S4) are a function of the supply voltage (Vdd).

In the exemplary embodiment depicted in FIG. 4A, the high power biasing network 318 includes a first resistor (R1), a second resistor (R2), and a third resistor (R3) coupled in series. The voltage provided to the gate of the second transistor 310 via the third switch (S3) may be approximately equal to the voltage across the first resistor (R1), and the voltage provided to the gate of the third transistor 312 via the fourth switch (S4) may be approximately equal to the sum of the voltages across the first resistor (R1) and the second resistor (R2).

Although the high power biasing network 318 is shown to have a voltage divider type configuration, it will appreciated that other circuit configurations may be used to implement the high power biasing network 318 such that the voltage applied to the gate of the second transistor 310 via the third switch (S3) and the voltage applied to the gate of the third transistor 312 via the fourth switch (S4) are a function of the supply voltage (Vdd).

Referring back to FIG. 3, the high power biasing network 318 may provide a logical low voltage signal (based on the supply voltage (Vdd)) to the gate of the second transistor 310 to operate the second transistor 310 in the saturation region when the third switch (S3) is activated. The second transistor 310 may also operate to amplify the input signal 294pa (e.g., a second stage amplification) during operation within the saturation region. For example, the gain may be based at least in part on the first stage amplification and the second stage amplification.

In addition, or in the alternative, the high power biasing network 318 may provide a logical low voltage signal (based on the supply voltage (Vdd)) to the gate of the third transistor 312 to operate the third transistor 312 in the saturation region when the fourth switch (S4) is activated. The third transistor 312 may also amplify the input signal 294pa (e.g., a third stage amplification) during operation within the saturation region. For example, the gain may be based at least in part on the first stage amplification and the third stage amplification.

Biasing the gates of the second transistor 310 and/or the third transistor 312 to operate in the saturation region may alleviate breakdown scenarios when the multi-stacked power amplifier 254pa operates in the high power mode. For example, when each transistor 308-312 operates in the saturation region, the relatively high voltage drift across the plurality of stacked transistors 304 (e.g., based on the supply voltage (Vdd)) may be distributed (e.g., shared) across each transistor 308-312 such that the transistors 308-312 do not breakdown.

During operation in the low power mode, the low power biasing network 316 may bias the gate of the second transistor 310 and/or the gate of the third transistor 312 such that the second transistor 310 and the third transistor 312, respectively, operate in a linear region. For example, the low power biasing network 316 may generate and provide a logical high voltage level signal (e.g., a first voltage (V1)) to the gate of the second transistor 310 via the first switch (S1) and/or to the gate of the third transistor 312 via the second switch (S2) so that the second and third transistors 310, 312, respectively, operate in the linear region. As described herein, a transistor operating in the "linear region" may correspond to a transistor operating with a relatively low sensitivity of the transistor drain-to-source conductivity to gate-to-source controlling voltage as compared to the sensitivity of the transistor drain-to-source conductivity of transistors biased to operate in the saturation region. However, "linear region" is not to be limited to scenarios in which a gate-to-source voltage of a transistor is greater than a threshold voltage of the transistor and a drain-to-source voltage is less than a difference between the gate-to-source voltage and the threshold voltage. Rather, "linear" is used to define a region with a relatively low sensitivity of the transistor drain-to-source conductivity to gate-to-source controlling voltage and may also include a weak inversion region or a triode region.

Figure 4B:
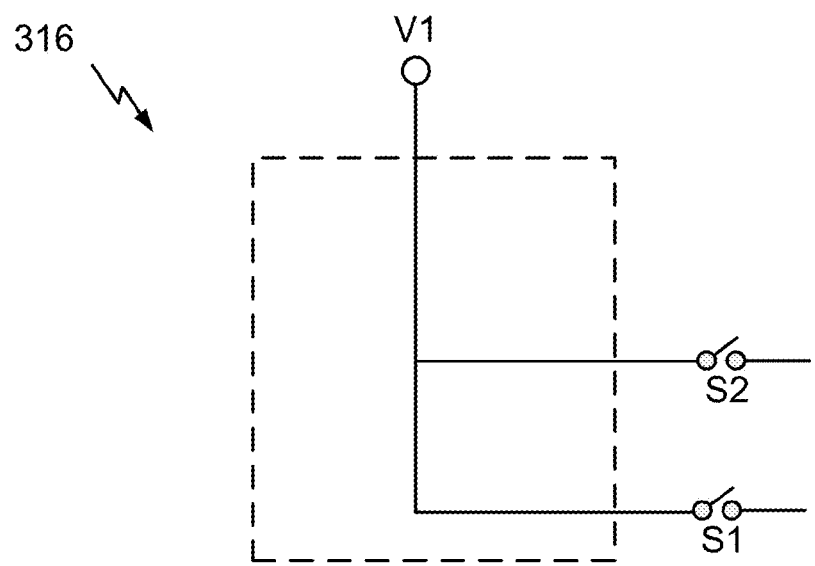
FIG. 4B is a diagram that depicts an exemplary embodiment of the low power biasing network of FIG. 3.

Referring to FIG. 4B, an exemplary embodiment of the low power biasing network 316 is shown. The low power biasing network 316 may be configured to provide the first voltage (V1) to the gate of the second transistor 310 via the first switch (S1) and to provide the first voltage (V1) to the gate of the third transistor 312 via the second switch (S2) when the first and second switches (S1, S2), respectively, are closed. In an exemplary embodiment, the first voltage (V1) may be approximately equal to 2.7V.

Referring back to FIG. 3, during operation in the low power mode (e.g., when the supply voltage (Vdd) is at the first level), the low power biasing network 316 may provide the first voltage (V1) to the gate of the second transistor 310 to operate the second transistor 310 in the linear region when the first switch (S1) is activated. Operating the second transistor 310 in the linear region may reduce amplification of the input signal 294pa at the second transistor 310 (e.g., reduce the gain at the second amplification stage) and cause the second transistor 310 to operate in a substantially similar manner as a low resistance-low impedance element (e.g., a small resistor or a low impedance switch).

In addition, or in the alternative, the low power biasing network 316 may provide the first voltage (V1) to the gate of the third transistor 312 to operate the third transistor 312 in the linear region when the second switch (S2) is activated. Operating the third transistor 312 in the linear region may reduce amplification of the input signal 294pa at the third transistor 312 (e.g., reduce the gain at the third amplification stage) and cause the third transistor 312 to operate in a substantially similar manner as a low resistance-low impedance element.

Biasing the gates of the second transistor 310 and/or the third transistor 312 to operate in the linear region may permit a reduced supply voltage (Vdd) during the low power mode to reduce power consumption. For example, when the supply voltage (Vdd) is at the first voltage level during the low power mode, overvoltage stress on the second transistor 310 and the third transistor 312 is reduced (e.g., the voltage drift is reduced) because the voltage drift is smaller. Reducing stress on the second transistor 310 and the third transistor 312 reduces the likelihood of breakdown. Thus, the low power biasing network 316 may control, or "tune out", the second transistor 310 and the third transistor 312 by biasing the respective gates at the first voltage (V1) to operate the transistors 310-312 in the linear region, effectively turning the multi-stacked power amplifier 254*pa* into a single-stacked power amplifier. For example, the multi-stacked power amplifier 254*pa* may effectively have a single amplification stage at the first transistor 308.

Although the embodiments described above illustrate that the gates of the second and third transistors 310, 312 are coupled to the low power biasing network 316 during the low power mode and coupled to the high power biasing network 318 during the high power mode, in other exemplary embodiments, the gates of the transistors may be selectively coupled to different biasing networks during the low power mode. For example, the gate of the second transistor 310 may be coupled to the low power biasing network 316 while the gate of the third transistor 312 is coupled to the high power biasing network 318 to further adjust the gain during the low power mode. To illustrate, the first switch (S1) may couple the gate of the second transistor 310 to the low power biasing network 316 and the fourth switch (S4) may couple the gate of the third transistor 312 to the high power biasing network 318. Alternatively, the gate of the second transistor 310 may be coupled to the high power biasing network 318 while the gate of the third transistor 312 is coupled to the low power biasing network 318 to further adjust the gain during the low power mode. To illustrate, the second switch (S2) may couple the gate of the third transistor 312 to the low power biasing network 316 and the third switch (S3) may couple the gate of the second transistor to the high power biasing network 318.

Additionally, although the embodiments described above are directed towards NMOS transistors, in other exemplary embodiments, the techniques may be applied to multi-stacked power amplifiers using p-type metal oxide semiconductor transistors in a "stacked" or "cascoded" configuration. Additionally, the techniques may be applied to multi-stacked power amplifiers using bipolar junction transistors (BJTs) in a stacked or cascoded configuration.

In another exemplary embodiment, additional stacked transistors may be coupled in parallel to the plurality of stacked transistors 304. The additional stacked transistors may be selectively activated to adjust the gain of the multi-stacked power amplifier 254*pa*. For example, during the high power mode, the additional stacked transistors may be activated to increase the gain (e.g., increase the current propagating between the supply voltage (Vdd) and ground) of the multi-stacked power amplifier 254*pa*. During the low power mode, the additional stacked transistors may be deactivated to decrease the gain of the multi-stacked power amplifier 254*pa*.

The biasing techniques described with respect to the low power biasing network 316 and the high power biasing network 318 may reduce the number of transmission paths used to cover a wide range of transmission power levels. Reducing the number of transmission paths may also reduce integrated circuit (IC) area. The low power biasing network 316 may also enable the multi-stacked power amplifier 254*pa* (e.g., a multi-stacked CMOS power amplifier) to reach low transmission DC power consumption levels of a single-stacked Gallium Arsenic (GaAs) power amplifier by "tuning out" the second and third transistors 310, 312.

Figure 5:
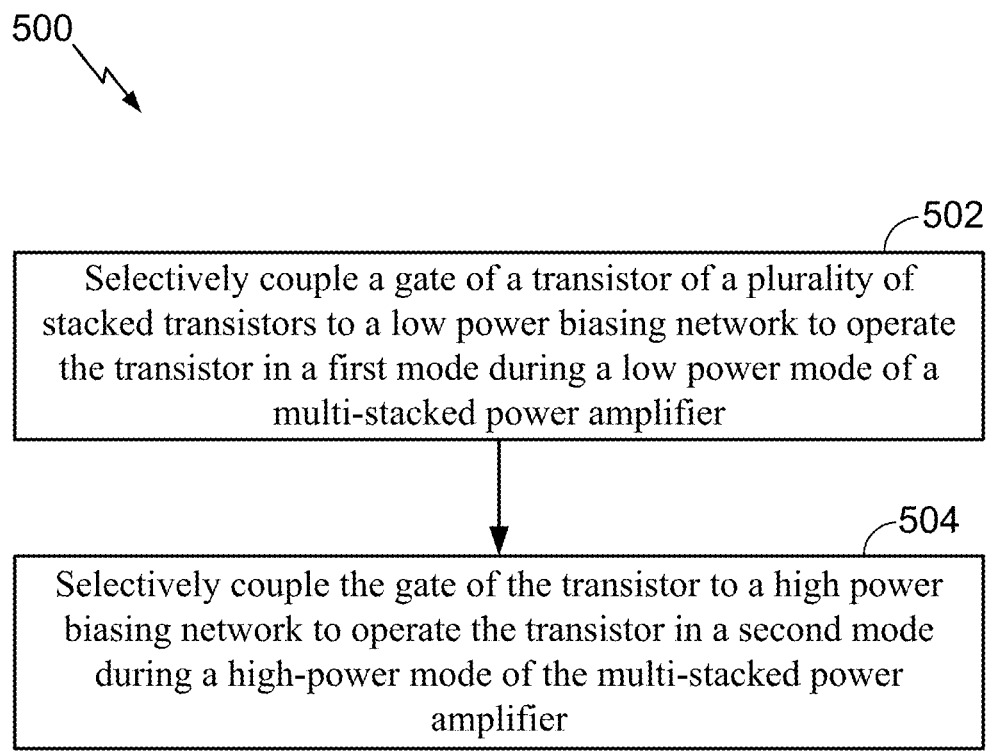
FIG. 5 is a flowchart that illustrates an exemplary embodiment of a method of operating a multi-stacked power amplifier.

Referring to FIG. 5, a flowchart illustrates an exemplary embodiment of a method 500 of operating a multi-stacked power amplifier. In an exemplary embodiment, the method 500 may be performed using the wireless device 110 of FIGS. 1-2, the multi-stacked power amplifier 254*pa* of FIGS. 2-3, or any combination thereof.

The method includes selectively coupling a gate of a transistor of a plurality of stacked transistors to a low power biasing network to operate the transistor in a first mode during a low power mode of a multi-stacked power amplifier, at 502. For example, referring to FIG. 3, the first switch (S1) may couple the gate of the second transistor 310 to the low power biasing network 316 when the multi-stacked power amplifier 254*pa* is operating in the low power mode. The low power biasing network 316 may bias the gate of the second transistor 310 such that the second transistor 310 operates in a first mode (e.g., the linear region). Additionally, the second switch (S2) may couple the gate of the third transistor 312 to the low power biasing network 316 when the multi-stacked power amplifier 254*pa* is operating in the low power mode. The low power biasing network 316 may bias the gate of the third transistor 312 such that the third transistor 312 operates in the first mode. Operating the second transistor 310 and the third transistor 312 in the linear region may "tune out" the second transistor 310 and the third transistor 312, effectively turning the multi-stacked power amplifier 254*pa* into a single-stacked power amplifier capable of operating with a reduced supply voltage (Vdd).

The gate of the transistor may be selectively coupled to a high power biasing network to operate the transistor in a second mode during a high-power mode of the multi-stacked power amplifier, at 504. For example, referring to FIG. 3, the third switch (S3) may couple the gate of the second transistor 310 to the high power biasing network 318 when the multi-stacked power amplifier 254*pa* is operating in the high power mode. The high power biasing network 316 may bias the gate of the second transistor 310 such that the second transistor 310 operates in a second mode (e.g., the saturation region). Additionally, the fourth switch (S4) may couple the gate of the third transistor 312 to the high power biasing network 318 when the multi-stacked power amplifier 254*pa* is operating in the high power mode. The high power biasing network 316 may bias the gate of the third transistor 312 such that the third transistor 312 operates in the second mode. Operating the second transistor 310 and the third transistor 312 in the saturation region may alleviate breakdown scenarios when the multi-stacked power amplifier 254*pa* operates in the high power mode. For example, when the transistors 308-312 operate in the saturation region, the relatively high voltage drift across the plurality of stacked transistors 304 may be distributed (e.g., shared) across each transistor 308-312 such that the transistors 308-312 do not breakdown. Additionally, each transistor 308-312 operating in the saturation region may increase the gain of the input signal 294*pa* during the high power mode. For example, during the high power mode, the increased transconductance of each transistor 308-312 may permit each transistor 308-312 to "amplify" the input signal 294 at a respective amplification stage to generate the amplified signal 294*pa*.

The method 500 of FIG. 5 may reduce the number of transmission paths used to cover a wide range of transmission power levels. For example, the method 500 may operate the multi-stacked transistor 254*pa* in a low power mode and in a high power mode using a single path (e.g., the plurality of stacked transistors 304) by biasing the gates of the second and third transistors 310, 312 to operate in either the first mode or the second mode. Reducing the number of paths may also reduce integrated circuit (IC) area. The low power biasing network 316 may also enable the multi-stacked power amplifier 254pa (e.g., a multi-stacked CMOS power amplifier) to reduce transmission DC power consumption levels (e.g., to a power level of a single-stacked Gallium Arsenic (GaAs) power amplifier) by "tuning out" the second and third transistors 310, 312.

In conjunction with the described embodiments, an apparatus includes means for amplifying an input signal. The means for amplifying the input signal may include a plurality of stacked transistors, where each transistor may be configured to operate in a first mode and in a second mode. For example, the means for amplifying an input signal in a multi-stacked power amplifier may include the plurality of stacked transistors 304 of FIG. 3, one or more other devices, circuits, or any combination thereof.

The apparatus may also include first means for generating a bias voltage configured to bias at least one transistor in the plurality of stacked transistors to operate in the first mode. For example, the first means for generating the bias voltage may include the low power biasing network 316 of FIGS. 3 and 4B, one or more other devices, circuits, or any combination thereof.

The apparatus may also include second means for generating a bias voltage configured to bias at least one transistor in the plurality of stacked transistors to operate in the second mode. For example, the second means for generating the bias voltage may include the high power biasing network 318 of FIGS. 3 and 4A, one or more other devices, circuits, or any combination thereof.

The apparatus may also include third means for generating a bias voltage coupled to a gate of a first transistor of the plurality of stacked transistors. For example, the third means for generating the bias voltage may include the first gate biasing network 314 of FIG. 3, one or more other devices, circuits, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a first biasing network;
a second biasing network;
a plurality of switches coupled to the first biasing network and to the second biasing network; and
a plurality of stacked transistors in a multi-stacked power amplifier, at least one transistor of the plurality of stacked transistors directly coupled to at least one switch of the plurality of switches via a node,
the first biasing network configured to bias the at least one transistor to operate in a first mode and
the second biasing network configured to bias the at least one transistor to operate in a second mode.

2. The apparatus of claim 1, further comprising:
a first switch of the plurality of switches configured to couple a gate of a first transistor of the plurality of stacked transistors to the first biasing network; and
a second switch of the plurality of switches configured to couple a gate of a second transistor of the plurality of stacked transistors to the first biasing network.

3. The apparatus of claim 2, further comprising:
a third switch of the plurality of switches configured to couple the gate of the first transistor of the plurality of stacked transistors to the second biasing network; and
a fourth switch of the plurality of switches configured to couple the gate of the second transistor of the plurality of stacked transistors to the second biasing network.

4. The apparatus of claim 1, wherein the first biasing network comprises a circuit configured to generate a first voltage to cause the at least one transistor to operate in the first mode, and wherein the second biasing network comprises a voltage divider circuit configured to generate a second voltage to cause the at least one transistor to operate in the second mode.

5. The apparatus of claim 1, further comprising an input matching network coupled to a gate of a first transistor of the plurality of stacked transistors.

6. The apparatus of claim 1, further comprising an output matching network coupled to an output of a transistor of the plurality of stacked transistors.

7. The apparatus of claim 1, wherein the first mode corresponds to a linear region of operation, and wherein the second mode corresponds to a saturation region of operation.

8. An apparatus comprising:
means for amplifying an input signal in a multi-stacked power amplifier, the means for amplifying the input signal including a plurality of stacked transistors, at least one transistor of the plurality of stacked transistors configured to operate in a first mode and in a second mode;
first means for generating a first voltage to bias the at least one transistor to operate in the first mode;
second means for generating a second voltage to bias the at least one transistor to operate in the second mode; and
means for switching between the first means for generating the first voltage and the second means for generating the second voltage, the means for switching including a plurality of switches configured to couple the at least one transistor to the first means for generating the first voltage or to the second means for generating the second voltage, the at least one transistor directly coupled to at least one switch of the plurality of switches via a node.

9. The apparatus of claim 8, wherein the means for switching further comprises:
first means for switching configured to couple a gate of a first transistor of the plurality of stacked transistors to the first means for generating the first voltage; and
second means for switching configured to couple a gate of a second transistor of the plurality of stacked transistors to the first means for generating the first voltage.

10. The apparatus of claim 9, further comprising:
third means for switching configured to couple the gate of the first transistor of the plurality of stacked transistors to the second means for generating the second voltage; and
fourth means for switching configured to couple the gate of the second transistor of the plurality of stacked transistors to the second means for generating the second voltage.

11. The apparatus of claim 8, wherein the first means for generating the first voltage comprises a circuit configured to provide the first voltage to a gate of the at least one transistor to cause the at least one transistor to operate in the first mode, and wherein the second means for generating the second voltage comprises a voltage divider circuit configured to provide the second voltage to a gate of the at least one transistor to cause the at least one transistor to operate in the second mode.

12. The apparatus of claim 8, wherein the first mode corresponds to a linear region of operation, and wherein the second mode corresponds to a saturation region of operation.

13. A method comprising:
receiving a signal to operate a multi-stacked power amplifier at a first power or a second power, the first power less than the second power;
based on the signal indicating the first power, coupling a gate of a transistor of a plurality of stacked transistors of the multi-stacked power amplifier to a first biasing network via a first switch of a plurality of switches that is coupled directly to the transistor via a node to operate the transistor in a first mode; and
based on the signal indicating the second power, coupling the gate of the transistor to a second biasing network via a second switch of the plurality of switches to operate the transistor in a second mode.

14. The method of claim 13, wherein the first mode corresponds to a linear region of operation of the transistor, and wherein the second mode corresponds to a saturation region of operation of the transistor.

15. The apparatus of claim 1, further comprising:
a direct current to direct current (DC-DC) converter coupled to a voltage source associated with the plurality of stacked transistors and configured to cause the voltage source to operate at a first voltage corresponding to a first power of the multi-stacked power amplifier or at a second voltage corresponding to a second power of the multi-stacked power amplifier, the first voltage less than the second voltage.

16. The apparatus of claim 1, wherein the plurality of switches is further configured to respond to a control signal to couple the at least one transistor to the first biasing network to cause the multi-stacked power amplifier to operate at a first power or to the second biasing network to cause the multi-stacked power amplifier to operate at a second power, the first power less than the second power.

17. The apparatus of claim 8, further comprising means for operating a voltage source associated with the plurality of stacked transistors at a first voltage corresponding to a first power of the multi-stacked power amplifier or at a second voltage corresponding to a second power of the multi-stacked power amplifier, the first voltage less than the second voltage.

18. The apparatus of claim 8, wherein the means for switching is configured to respond to a control signal to couple the at least one transistor to the first means for generating the first voltage or to the second means for generating the second voltage.

19. The method of claim 13, further comprising:
based on the signal indicating the first power, coupling, via the first switch of the plurality of switches, the first biasing network to a gate of a first transistor of the plurality of stacked transistors and, via a third switch of the plurality of switches, to a gate of a second transistor of the plurality of stacked transistors.

20. The method of claim 13, further comprising:
receiving at the plurality of stacked transistors a first voltage corresponding to a first power of the multi-stacked power amplifier or a second voltage corresponding to a second power of the multi-stacked power amplifier, the first voltage greater than the second voltage.

* * * * *